United States Patent
Tominaga et al.

(10) Patent No.: US 10,460,973 B2
(45) Date of Patent: Oct. 29, 2019

(54) ADHESIVE TAPE FOR SEMICONDUCTOR PROCESSING AND METHOD FOR PRODUCING SEMICONDUCTOR DEVICE

(71) Applicant: LINTEC CORPORATION, Itabashi-ku (JP)

(72) Inventors: Tomochika Tominaga, Isahaya (JP); Katsuhiko Horigome, Shiraoka (JP)

(73) Assignee: LINTEC CORPORATION, Itabashi-ku (JP)

( * ) Notice: Subject to any disclaimer, the term of this patent is extended or adjusted under 35 U.S.C. 154(b) by 0 days.

(21) Appl. No.: 15/768,652

(22) PCT Filed: Mar. 2, 2017

(86) PCT No.: PCT/JP2017/008313
§ 371 (c)(1),
(2) Date: Apr. 16, 2018

(87) PCT Pub. No.: WO2017/150675
PCT Pub. Date: Sep. 8, 2017

(65) Prior Publication Data
US 2018/0308739 A1    Oct. 25, 2018

(30) Foreign Application Priority Data

Mar. 3, 2016 (JP) ................................ 2016-041259

(51) Int. Cl.
| | |
|---|---|
| *H01L 21/683* | (2006.01) |
| *B23K 26/53* | (2014.01) |
| *C09J 7/38* | (2018.01) |
| *C09J 7/25* | (2018.01) |
| *C09J 7/50* | (2018.01) |
| *H01L 21/78* | (2006.01) |

(52) U.S. Cl.
CPC .......... *H01L 21/6836* (2013.01); *B23K 26/53* (2015.10); *C09J 7/255* (2018.01); *C09J 7/385* (2018.01); *C09J 7/50* (2018.01); *H01L 21/78* (2013.01); *C09J 2203/326* (2013.01); *C09J 2205/114* (2013.01); *C09J 2433/003* (2013.01); *C09J 2467/006* (2013.01); *H01L 2221/68327* (2013.01); *H01L 2221/68381* (2013.01)

(58) Field of Classification Search
CPC ... H01L 21/6836; H01L 21/683; H01L 21/78; H01L 21/00; H01L 21/68778; H01L 21/304; H01L 21/58; H01L 21/60; C09J 5/00; C09J 5/04; C09J 7/29; C09J 7/50
USPC ......................................... 438/464, 118, 119
See application file for complete search history.

(56) References Cited

U.S. PATENT DOCUMENTS

| | | | |
|---|---|---|---|
| 2005/0269717 A1 | 12/2005 | Ohashi et al. | |
| 2014/0053972 A1* | 2/2014 | Bries ......................... | C09J 7/29 |
| | | | 156/235 |
| 2014/0065414 A1* | 3/2014 | Tamura ...................... | C09J 7/25 |
| | | | 428/345 |
| 2017/0025303 A1 | 1/2017 | Morita et al. | |

FOREIGN PATENT DOCUMENTS

| | | |
|---|---|---|
| JP | 2005-343997 A | 12/2005 |
| JP | 2015-183008 A | 10/2015 |
| WO | WO 2015/156389 A1 | 10/2015 |

OTHER PUBLICATIONS

International Search Report dated May 9, 2017 in PCT/JP2017/008313, filed on Mar. 2, 2017.

* cited by examiner

*Primary Examiner* — Chuong A Luu
(74) *Attorney, Agent, or Firm* — Oblon, McClelland, Maier & Neustadt, L.L.P.

(57) ABSTRACT

The pressure sensitive adhesive tape for semiconductor processing of the present invention is a pressure sensitive adhesive tape for semiconductor processing, which, in a step of grinding a back face of a semiconductor wafer having a groove formed on a front face thereof or having a modified region formed therein to singulate the semiconductor wafer into semiconductor chips, is stuck on the front face of the semiconductor wafer and used, the pressure sensitive adhesive tape for semiconductor processing including a base, a buffer layer provided on one face of the base, and a pressure sensitive adhesive layer provided on the other face of the base, and having a ratio (D2/D1) of a thickness (D2) of the buffer layer to a thickness (D1) of the base of 0.7 or less and an indentation depth (X) of the front face on the buffer layer side of 2.5 μm or less.

20 Claims, No Drawings

ADHESIVE TAPE FOR SEMICONDUCTOR PROCESSING AND METHOD FOR PRODUCING SEMICONDUCTOR DEVICE

TECHNICAL FIELD

The present invention relates to a pressure sensitive adhesive tape for semiconductor processing, which is to be stuck to a semiconductor wafer in producing a semiconductor device by the dicing before grinding method, and a method for producing a semiconductor device using the pressure sensitive adhesive tape.

BACKGROUND ART

Amid the advance of miniaturization and multi-functionalization of various electronics, semiconductor chips to be mounted thereon are similarly required to achieve miniaturization and thinning. For the purpose of achieving thinning of the chip, it is general to grind the back face of a semiconductor wafer to perform thickness adjustment. In addition, a method which is called as the dicing before grinding method in which after forming a groove having a predetermined depth from the front face side of a wafer, grinding is performed from the wafer back face side, thereby achieving singulation of the chip by the grinding is occasionally utilized. In the dicing before grinding method, the back face grinding of the chip and the singulation of the chip can be simultaneously performed, and therefore, it is possible to efficiently produce a thin type chip. Further, in the dicing before grinding method, in addition to the method in which after forming a groove having a predetermined depth from the front face side of a wafer, grinding is performed from the wafer back face side as described above, there is also a method in which a modified layer is provided in the inside of the wafer by using a laser, and singulation of the chip is performed by a pressure, etc. at the time of wafer back face grinding.

Conventionally, at the time of back face grinding of a semiconductor wafer, in order to protect the circuit of the wafer front face and to fix the semiconductor wafer and the singulated semiconductor chips, it is general to stick a pressure sensitive adhesive tape called as a back grind sheet to the wafer front face. As the back grind sheet which is used in the dicing before grinding method, there is known a pressure sensitive adhesive sheet including a base and a pressure sensitive adhesive layer provided on one face of the base, wherein a buffer layer is further provided on the other face side of the base.

In the back grind sheet, by providing the buffer layer, it is possible to relieve a vibration generated at the time of wafer back face grinding. In addition, in the semiconductor wafer, in view of the matter that at the time of back face grinding, the wafer front face side on which the back grind sheet is provided is adsorbed on a chuck table, the semiconductor wafer is fixed to the table; however, it is also possible to absorb irregularities to be caused due to a foreign substance, etc. existent on the table by the buffer layer. The back grind sheet prevents cracking of the semiconductor wafer, chipping of the chip, etc. as generated at the time of back face grinding due to the forgoing actions of the buffer layer.

In addition, PTL 1 discloses a pressure sensitive adhesive sheet including a base, a pressure sensitive adhesive layer, and a buffer layer as described above, wherein the base is regulated to have a thickness of 10 to 150 μm and a Young's modulus of 1,000 to 30,000 MPa; and the buffer layer is regulated to have a thickness of 5 to 80 μm and a maximum value of tan δ of dynamic viscoelasticity of 0.5 or more. PTL 1 discloses that by using this pressure sensitive adhesive sheet as a back grind sheet in producing a semiconductor chip by the dicing before grinding method, chipping and discoloration of the chip can be prevented.

CITATION LIST

Patent Literature

PTL 1: JP 2005-343997 A

SUMMARY OF INVENTION

Technical Problem

But, the requirements for thinning and miniaturization of semiconductor chips have been further increasing recently, and for example, production of semiconductor chips having a thickness of less than 50 μm or having a size of 0.5 mm in square has also been being demanded. In producing such miniaturized and thinned semiconductor chips, by only setting the thickness of each of the base and the buffer layer to a certain range while adjusting the Young's modulus of the base and the maximum value of tan δ of the buffer layer as described in PTL 1, it is occasionally difficult to thoroughly inhibit chip chipping (chip cracking) generated in an end part or edge part of the semiconductor chip.

In addition, in the case where the cleanness of a clean room is low, a relatively large foreign substance is occasionally adsorbed on a chuck table of a wafer back face grinding apparatus. In consequence, in order to enhance absorbability of a foreign substance, it may also be considered to enhance the flexibility of the face of the pressure sensitive adhesive tape on the buffer layer side depending upon the usage environment. But, if the flexibility on the buffer layer side is enhanced, in a buffer layer and a base each having a usual thickness, a vibration generated in the semiconductor chip at the time of back face grinding cannot be occasionally thoroughly inhibited, and in the case of producing a thinned and miniaturized semiconductor chip, chip chipping is occasionally generated due to such a vibration.

In view of the foregoing circumstances, the present invention has been made, and a problem thereof is to provide a pressure sensitive adhesive tape for semiconductor processing, in which even in the case of producing a thinned and miniaturized semiconductor chip by the dicing before grinding method, generation of chipping in the semiconductor chip is prevented.

Solution to Problem

The present inventors made extensive and intensive investigations, and as a result, it has been found that by regulating an indentation depth of the front face on the buffer layer side to a predetermined value or less while regulating a ratio in thickness of a buffer layer and a base to a fixed range, chipping of a semiconductor chip generated when a semiconductor wafer is ground and singulated into semiconductor chips can be presented, thereby leading to accomplishment of the following present invention.

The present invention provides the following (1) to (9).
(1) A pressure sensitive adhesive tape for semiconductor processing, which, in a step of grinding a back face of a semiconductor wafer having a groove formed on a front face thereof or having a modified region formed therein to singulate the semiconductor wafer into semiconductor chips, is stuck on the front face of the semiconductor wafer and used, the pressure sensitive adhesive tape for semiconductor processing including a base, a buffer layer provided on one face of the base, and a pressure sensitive adhesive layer provided on the other face of the base, and having a ratio (D2/D1) of a thickness (D2) of the buffer layer to a thickness (D1) of the base of 0.7 or less and an indentation depth (X) of the front face on the buffer layer side of 2.5 μm or less.

(2) The pressure sensitive adhesive tape for semiconductor processing as set forth in the above (1), wherein the base has a Young's modulus of 1,000 MPa or more.

(3) The pressure sensitive adhesive tape for semiconductor processing as set forth in the above (1) or (2), wherein the thickness (D1) of the base is 110 μm or less.

(4) The pressure sensitive adhesive tape for semiconductor processing as set forth in any one of the above (1) to (3), wherein the base has at least a polyethylene terephthalate film.

(5) The pressure sensitive adhesive tape for semiconductor processing as set forth in any one of the above (1) to (4), wherein the buffer layer is formed of a buffer layer-forming composition including a urethane (meth)acrylate (a1), a polymerizable compound (a2) having an alicyclic group or a heterocyclic group each having a ring-forming atom number of 6 to 20, and a polymerizable compound (a3) having a functional group.

(6) The pressure sensitive adhesive tape for semiconductor processing as set forth in the above (5), wherein the component (a2) is an alicyclic group-containing (meth)acrylate, and the component (a3) is a hydroxyl group-containing (meth)acrylate.

(7) The pressure sensitive adhesive tape for semiconductor processing as set forth in any one of the above (1) to (6), wherein the pressure sensitive adhesive layer has an elastic modulus at 23° C. of 0.10 to 0.50 MPa.

(8) The pressure sensitive adhesive tape for semiconductor processing as set forth in any one of the above (1) to (7), wherein the pressure sensitive adhesive layer has a thickness (D3) of 70 μm or less.

(9) A method for producing a semiconductor device, including:

a step of sticking the pressure sensitive adhesive tape for semiconductor processing as set forth in any one of the above (1) to (8) on a front face of a semiconductor wafer;

a step of forming a groove from the front face side of the semiconductor wafer, or forming a modified region in the inside of the semiconductor wafer from the front face or back face of the semiconductor wafer;

a step of grinding the semiconductor wafer in which the pressure sensitive adhesive tape for semiconductor processing is stuck on the front face thereof, and the groove or modified region is formed, from the back face side to singulate the semiconductor wafer into plural chips starting from the groove or modified region; and a step of releasing the pressure sensitive adhesive tape for semiconductor processing from the plural chips.

Advantageous Effects of Invention

In the present invention, it is possible to prevent chipping of a semiconductor chip generated when a semiconductor wafer is ground and singulated into chips in the dicing before grinding method.

DESCRIPTION OF EMBODIMENTS

Next, the present invention is described in more detail.

In the present description, the term "weight average molecular weight (Mw)" is a value expressed in terms of polystyrene as measured by the gel permeation chromatography (GPC), and specifically, it is a value measured on the basis of the method as described in the Examples.

In addition, for example, the term "(meth)acrylate" is used as a term expressing both "acrylate" and "methacrylate", and the same is also applicable to other analogous terms.

The pressure sensitive adhesive tape for semiconductor processing of the present invention (hereinafter also referred to simply as "pressure sensitive adhesive tape") is one including a base, a buffer layer provided on one face of the base, and a pressure sensitive adhesive layer provided on the other face of the base (namely, a face of the opposite side to the face on which the buffer layer is provided).

The pressure sensitive adhesive tape is one which is stuck on a front face of a semiconductor wafer via a pressure sensitive adhesive layer and used in the dicing before grinding method. That is, the present sensitive adhesive tape is one which in a step of grinding a back face of a semiconductor wafer having a groove formed on a front face thereof or having a modified region formed therein, to singulate the semiconductor wafer into semiconductor chips by the grinding, is stuck on the front face of the semiconductor wafer and used, as described later.

In the pressure sensitive adhesive tape of the present invention, a ratio (D2/D1) of a thickness (D2) of the buffer layer to a thickness (D1) of the base is 0.7 or less, and an indentation depth (X) of the front face on the buffer layer side is 2.5 μm or less.

In the present invention, the indentation depth (X) of the front face on the buffer layer side means an indentation depth which is necessary for a compression load to reach 2 mN on indenting a triangular pyramid indenter having a tip radius of curvature of 100 nm and an apex angle of 115° into the face of the pressure sensitive adhesive tape on the buffer layer side at a rate of 10 μm/min. A specific measuring method of the indentation depth (X) is described in the Examples.

In the present invention, when the thickness ratio (D2/D1) is 0.7 or less, a vibration in other portion than the pressure sensitive adhesive of the pressure sensitive adhesive tape at the time of back face grinding is hardly generated. That is, so far as the whole of the pressure sensitive adhesive tape is even concerned, the vibration is smaller than that in the case where the thickness ratio is more than 0.7. When the vibration is small, even in the case of producing a small and thin semiconductor chip by the dicing before grinding method, it becomes possible to prevent chipping of the semiconductor chip generated on singulation by back face grinding.

On the other hand, when the indentation depth (X) is more than 2.5 μm, a performance of the buffer layer, such as absorbability of a foreign substance, becomes good; however, in the case of singulating the semiconductor wafer into small and thin semiconductor chips by the dicing before grinding method, chipping of the semiconductor chip cannot be appropriately prevented. In addition, when the thickness ratio (D2/D1) is more than 0.7, in the pressure sensitive adhesive tape, a portion with low rigidity increases, and the vibration is liable to occur in the semiconductor wafer or chip at the time of back face grinding. For example, in the case of singulation into small and thin semiconductor chips by the dicing before grinding method, chipping of the semiconductor chip is hardly prevented.

In order to prevent chip chipping on singulation into semiconductor chips while making impact absorptivity of the buffer layer appropriate, the indentation depth (X) is preferably 1.0 to 2.5 µm, and more preferably 1.5 to 2.4 µm.

In order to regulate the buffer layer to an appropriate thickness to make a buffer performance of the pressure sensitive adhesive tape favorable while more reducing the chip chipping at the time of back face grinding, the thickness ratio (D2/D1) is preferably 0.10 to 0.70, and more preferably 0.13 to 0.66.

For example, by properly changing the kinds or contents of the components included in a buffer layer-forming composition which forms the buffer layer, a degree of curing of the buffer layer, etc., it is possible to regulate the indentation depth (X) so as to belong to the aforementioned range. Furthermore, it is possible to regulate the indentation depth (X) by changing the thickness of the buffer layer or the thickness of the base. For example, when the buffer layer is made thin, the indentation depth (X) tends to become small. On the other hand, when the base is made thin, the indentation depth (X) tends to become large.

Next, the configurations of the respective members of the pressure sensitive adhesive tape of the present invention are described in more detail.

[Base]

As the base of the pressure sensitive adhesive tape, various resin films can be exemplified. Specifically, examples thereof include resin films made of at least one selected from polyolefins, such as a polyethylene, e.g., low density polyethylene (LDPE), linear low density polyethylene (LLDPE), and high density polyethylene (HDPE), polypropylene, polybutene, polybutadiene, polymethylpentene, an ethylene-norbornene copolymer, a norbornene resin, etc.; ethylene-based copolymers, such as an ethylene-vinyl acetate copolymer, an ethylene-(meth)acrylic acid copolymer, and an ethylene-(meth)acrylic acid ester copolymer; polyvinyl chlorides, such as polyvinyl chloride and a vinyl chloride copolymer; polyesters, such as polyethylene terephthalate, polyethylene naphthalate, polybutylene terephthalate, and a fully aromatic polyester; a polyurethane; a polyimide; a polyamide; a polycarbonate; a fluorine resin; a polyacetal; a modified phenylene oxide; a polyphenylene sulfide; a polysulfone; a polyether ketone; and an acrylic polymer. In addition, modified films, such as crosslinked films and ionomer films, of the foregoing films are also usable. The base may be either a single-layered film of a resin film made of one or more resins selected from the foregoing resins, or a laminated film resulting from lamination of two or more of the foregoing resin films.

The base is preferably a rigid base having a Young's modulus of 1,000 MPa or more, and the Young's modulus is more preferably 1,800 to 30,000 MPa, and still more preferably 2,500 to 6,000 MPa.

In this way, when a rigid base having a high Young's modulus is used as the base, an effect for inhibiting the vibration by the pressure sensitive adhesive tape at the time of back face grinding is high, and the chipping of the semiconductor chip is readily prevented. In addition, when the Young's modulus falls within the aforementioned range, a stress which is necessary on releasing the pressure sensitive adhesive tape from the semiconductor chip becomes small, and a damage of the chip generated at the time of tape release is readily prevented. Furthermore, it is also possible to make workability on sticking the pressure sensitive adhesive tape on the semiconductor wafer favorable.

Here, the rigid base having a Young's modulus of 1,000 MPa or more may be properly selected among the afore- mentioned resin films. Examples thereof include films made of a polyester, such as polyethylene terephthalate, polyethylene naphthalate, polybutylene terephthalate, a fully aromatic polyester, etc., a polyimide, a polyamide, a polycarbonate, a polyacetal, a modified polyphenylene oxide, a polyphenylene sulfide, a polysulfone, a polyether ketone, and a biaxially stretched polypropylene.

Among those resin films, a film including at least one selected from a polyester film, a polyamide film, a polyimide film, and a biaxially stretched polypropylene film is preferred, a film including a polyester film is more preferred, and a film including a polyethylene terephthalate film is still more preferred.

The thickness (D1) of the base is preferably 110 µm or less, more preferably 15 to 110 µm, and still more preferably 20 to 105 µm. When the thickness of the base is 110 µm or less, it becomes easy to regulate the thickness ratio (D2/D1) to the aforementioned predetermined value. In addition, when the thickness of the base is 15 µm or more, the base becomes easy to accomplish a function as a support of the pressure sensitive adhesive tape.

The base may contain a plasticizer, a lubricant, an infrared light absorber, an ultraviolet light absorber, a filler, a coloring agent, an antistatic agent, an antioxidant, a catalyst, etc. within a range where the effects of the present invention are not impaired. In addition, the base may be either transparent or opaque, and if desired, it may be colored or vapor-deposited.

In order to improve adhesion to at least one of the buffer layer and the pressure sensitive adhesive layer, at least one front face of the base may be subjected to an easy adhesion treatment, such as a corona treatment. In addition, the base may also be one having the aforementioned resin film and an easily adhesive layer coated on at least one front face of the resin film.

Though an easily adhesive layer-forming composition which forms the easily adhesive layer is not particularly limited, examples thereof include compositions including a polyester-based resin, a urethane-based resin, a polyester urethane-based resin, an acrylic resin, etc. The easily adhesive layer-forming composition may contain a crosslinking agent, a photopolymerization initiator, an antioxidant, a softener (plasticizer), a filler, a rust-preventing agent, a pigment, a dye, etc., as the need arises.

A thickness of the easily adhesive layer is preferably 0.01 to 10 µm, and more preferably 0.03 to 5 µm. In the easily adhesive layer, when its thickness is small relative to the thickness of the base, its influence giving to the Young's modulus is low, and even in the case when the base has the easily adhesive layer, the Young's modulus of the base is substantially identical to the Young's modulus of the resin film.

[Buffer Layer]

The buffer layer relieves the vibration to be caused due to grinding of the semiconductor wafer to prevent generation of cracking and chipping in the semiconductor wafer. In addition, while the semiconductor wafer having a pressure sensitive adhesive tape stuck thereon is disposed on a vacuum table at the time of back face grinding, when the buffer layer is provided, the pressure sensitive adhesive tape is readily appropriately held on the vacuum table.

The buffer layer of the present invention has a storage elastic modulus at 23° C. of preferably 100 to 1,500 MPa, and more preferably 200 to 1,200 MPa. In addition, a stress relaxation rate of the buffer layer is preferably 70 to 100%, and more preferably 78 to 98%.

When the buffer layer has a storage elastic modulus and a stress relaxation rate falling within the aforementioned ranges, it becomes possible to appropriately hold the semiconductor wafer having a pressure sensitive adhesive tape stuck thereon on a chuck table. In addition, an effect of the buffer layer for absorbing a vibration or impact of a grindstone generated at the time of back face grinding is high. Accordingly, as described above, even in the case where the thickness ratio (D2/D1) is 0.7 or less, and the thickness of the buffer layer is thin, the chip chipping generated at the time of back face grinding is readily prevented.

A maximum value of tan $\delta$ of dynamic viscoelasticity of the buffer layer at −5 to 120° C. (hereinafter also referred to simply as "maximum value of tan $\delta$") is preferably 0.7 or more, more preferably 0.8 or more, and still more preferably 1.0 or more. Though an upper limit of the maximum value of tan $\delta$ is not particularly limited, it is typically 2.0 or less.

When the maximum value of tan $\delta$ of the buffer layer is 0.7 or more, the effect of the buffer layer for absorbing a vibration or impact of a grindstone generated at the time of back face grinding is high. Accordingly, in the dicing before grinding method, even by grinding the semiconductor wafer or singulated semiconductor chip until it becomes extremely thin, it becomes easy to prevent generation of chipping in an edge, etc. of the chip.

The tan $\delta$ is called as a loss tangent, is defined by "(loss elastic modulus)/(storage elastic modulus)", and is a value measured in terms of a response to a stress given to an object by a dynamic viscoelasticity measuring apparatus, such as a tensile stress, and a torsional stress. Specifically, the tan $\delta$ means a value measured by the method as described in the Examples.

The thickness (D2) of the buffer layer is preferably 8 to 70 μm, more preferably 10 to 65 μm, and still more preferably 10 to 40 μm. When the thickness of the buffer layer is 8 μm or more, the buffer layer may appropriately buffer a vibration at the time of back face grinding. In addition, when the thickness of the buffer layer is 70 μm or less, it becomes easy to regulate the total thickness and thickness ratio (D2/D1) of the tape to the aforementioned predetermined values, respectively.

The buffer layer is preferably a layer formed of the buffer layer-forming composition including an energy ray-polymerizable compound. When the buffer layer includes an energy ray-polymerizable compound, it becomes possible to cure the buffer layer upon irradiation with an energy ray. The "energy ray" refers to an ultraviolet ray, an electron ray, etc., and an ultraviolet ray is preferably used.

More specifically, it is preferred that the buffer layer-forming composition includes a urethane (meth)acrylate (a1) and a polymerizable compound (a2) having an alicyclic group or a heterocyclic group each having a ring-forming atom number of 6 to 20. When the buffer layer-forming composition contains these two components, and the thickness (D2) of the buffer layer and the thickness (D1) of the base are allowed to fall within the aforementioned ranges, respectively, it becomes easy to regulate the indentation depth (X) to 2.5 μm or less. Furthermore, it becomes easy to allow the elastic modulus of the buffer layer, the stress relaxation rate of the buffer layer, and the maximum value of tan $\delta$ to fall within the aforementioned ranges, respectively. In addition, from these viewpoints, it is more preferred that the buffer layer-forming composition contains, in addition to the aforementioned components (a1) and (a2), a polymerizable compound (a3) having a functional group.

It is still more preferred that the buffer layer-forming composition contains, in addition to the aforementioned components (a1) and (a2) or the components (a1) to (a3), a photopolymerization initiator. The buffer layer-forming composition may contain other additives or resin components within a range where the effects of the present invention are not impaired.

The respective components which are included in the buffer layer-forming composition are hereunder described in detail.

(Urethane (Meth)acrylate (a1))

The urethane (met)acrylate (a1) is a compound having at least a (meth)acryloyl group and a urethane bond and having such properties that it is polymerized and cured upon irradiation with an energy ray. The urethane (met)acrylate (a1) is a polymer, such as an oligomer.

A mass average molecular weight (Mw) of the component (a1) is preferably 1,000 to 100,000, more preferably 2,000 to 60,000, and still more preferably 3,000 to 20,000. In addition, though the (meth)acryloyl group number (hereinafter also referred to as "functional group number") in the component (a1) may be monofunctional, bifunctional, trifunctional, or higher functional, it is preferably monofunctional or bifunctional.

The component (a1) can be, for example, obtained by allowing an isocyanate-terminated urethane prepolymer obtained through a reaction between a polyol compound and a polyvalent isocyanate compound, to react with a (meth)acrylate having a hydroxy group. The component (a1) may be used either alone or in combination of two or more thereof.

The polyol compound that is a raw material of the component (a1) is not particularly limited so long as it is a compound having two or more hydroxy groups. Specifically, examples of the polyol compound include an alkylene diol, a polyether type polyol, a polyester type polyol, and a polycarbonate type polyol. Among those, a polyester type polyol is preferred.

Though the polyol compound may be any of a bifunctional diol, a trifunctional triol, and a tetrafunctional or higher functional polyol, it is preferably a bifunctional diol, and more preferably a polyester type diol.

Examples of the polyvalent isocyanate compound include aliphatic polyisocyanates, such as tetramethylene diisocyanate, hexamethylene diisocyanate, and trimethylhexamethylene diisocyanate; alicyclic diisocyanates, such as isophorone diisocyanate, norbornane diisocyanate, dicyclohexylmethane-4,4'-diisocyanate, dicyclohexylmethane-2,4'-diisocyanate, and ω,ω'-diisocyanate dimethylcyclohexane; and aromatic diisocyanates, such as 4,4'-diphenylmethane diisocyanate, tolylene diisocyanate, xylylene diisocyanate, tolidine diisocyanate, tetramethylene xylylene diisocyanate, and naphthalene-1,5-diisocyanate.

Among those, isophorone diisocyanate, hexamethylene diisocyanate, and xylylene diisocyanate are preferred.

The urethane (meth)acrylate (a1) can be obtained by allowing an isocyanate-terminated urethane prepolymer obtained through a reaction between the aforementioned polyol compound and a polyvalent isocyanate compound, to react with a (meth)acrylate having a hydroxy group. The (meth)acrylate having a hydroxy group is not particularly limited so long as it is a compound having at least a hydroxy group and a (meth)acryloyl group in one molecule.

Specifically, examples of the (meth)acrylate having a hydroxy group include hydroxyalkyl (meth)acrylates, such as 2-hydroxyethyl (meth)acrylate, 2-hydroxypropyl (meth)acrylate, 4-hydroxybutyl (meth)acrylate, 4-hydroxycyclohexyl (meth)acrylate, 5-hydroxycyclooctyl (meth)acrylate, 2-hydroxy-3-phenyloxypropyl (meth)acrylate, pentaerythritol tri(meth)acrylate, polyethylene glycol mono(meth)acrylate, and polypropylene glycol mono(meth)acrylate; hydroxy group-containing (meth)acrylamides, such as N-methylol (meth)acrylamide; and reaction products obtained by allowing a diglycidyl ester of vinyl alcohol, vinylphenol, or bisphenol A to react with (meth)acrylic acid.

Among those, hydroxyalkyl (met)acrylates are preferred, and 2-hydroxyethyl (meth)acrylate is more preferred.

The condition under which the isocyanate-terminated urethane prepolymer and the (meth)acrylate having a hydroxy group are allowed to react with each other is preferably a condition under which the reaction is performed at 60 to 100° C. for 1 to 4 hours in the presence of a solvent and a catalyst, each of which is added, as the need arises.

The content of the component (a1) in the buffer layer-forming composition is preferably 10 to 70% by mass, more preferably 20 to 60% by mass, still more preferably 25 to 55% by mass, and yet still more preferably 30 to 50% by mass based on the total amount (100% by mass) of the buffer layer-forming composition.

(Polymerizable Compound (a2) Having an Alicyclic Group or a Heterocyclic Group Each Having a Ring-Forming Atom Number of 6 to 20)

The component (a2) is a polymerizable compound having an alicyclic group or a heterocyclic group each having a ring-forming atom number of 6 to 20 and is preferably a compound having at least one (meth)acryloyl group. By using this component (a2), the film forming properties of the obtained buffer layer-forming composition can be improved.

Though the ring-forming atom number of the alicyclic group or heterocyclic group which the component (a2) has is preferably 6 to 20, it is more preferably 6 to 18, still more preferably 6 to 16, and yet still more preferably 7 to 12. Examples of the atom which forms a ring structure of the foregoing heterocyclic ring include a carbon atom, a nitrogen atom, an oxygen atom, a sulfur atom, etc.

The ring-forming atom number represents the number of atoms which constitute the foregoing ring per se of the compound of a structure in which the atoms are cyclically bonded, and any atom which does not constitute the ring (for example, a hydrogen atom bonded to the atom constituting the ring), or any atom included in a substituent in the case where the foregoing ring is substituted with the substituent, is not included in the ring-forming atom number.

Specifically, examples of the component (a2) include alicyclic group-containing (meth)acrylates, such as isobornyl (meth)acrylate, dicyclopentenyl (meth)acrylate, dicyclopentanyl (meth)acrylate, dicyclopentenyloxy (meth)acrylate, cyclohexyl (meth)acrylate, and adamantane (meth) acrylate; and heterocyclic group-containing (meth)acrylates, such as tetrahydrofurfuryl (meth)acrylate, and morpholine (meth)acrylate.

The component (a2) may be used either alone or in combination of two or more thereof.

Among those, alicyclic group-containing (meth)acrylates are preferred, and isobornyl (meth)acrylate is more preferred.

The content of the component (a2) in the buffer layer-forming composition is preferably 10 to 70% by mass, more preferably 20 to 60% by mass, still more preferably 25 to 55% by mass, and yet still more preferably 30 to 50% by mass based on the total amount (100% by mass) of the buffer layer-forming composition.

(Polymerizable Compound (a3) Having a Functional Group)

The component (a3) is a polymerizable compound containing a functional group, such as a hydroxyl group, an epoxy group, an amide group, and an amino group, and is preferably a compound having at least one (meth)acryloyl group.

The component (a3) is favorable in compatibility with the component (a1) and readily regulates the viscosity of the buffer layer-forming composition to an appropriate range. In addition, the component (a3) readily allows the elastic modulus or the value of tan δ of the buffer layer formed of the foregoing composition to fall within the aforementioned range, and even when the buffer layer is made relatively thin, the buffer performance becomes favorable.

Examples of the component (a3) include a hydroxyl group-containing (meth)acrylate, an epoxy group-containing compound, an amide group-containing compound, an amino group-containing (meth)acrylate, etc.

Examples of the hydroxyl group-containing (meth)acrylate include 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, phenylhydroxypropyl (meth)acrylate, etc.

Examples of the epoxy group-containing compound include glycidyl (meth)acrylate, methylglycidyl (meth)acrylate, allylglycidyl ether, etc. Among those, an epoxy group-containing compound, such as glycidyl (meth)acrylate, and methylglycidyl (meth)acrylate, is preferred.

Examples of the amide group-containing compound include (meth)acrylamide, N,N-dimethyl (meth)acrylamide, N-butyl (meth)acrylamide, N-methylol (meth)acrylamide, N-methylolpropane (meth)acrylamide, N-methoxymethyl (meth)acrylamide, N-butoxymethyl (meth)acrylamide, etc.

Examples of the amino group-containing (meth)acrylate include a primary amino group-containing (meth)acrylate, a secondary amino group-containing (meth)acrylate, a tertiary amino group-containing (meth)acrylate, etc.

Among those, a hydroxyl group-containing (meth)acrylate is preferred, and a hydroxyl group-containing (meth) acrylate having an aromatic ring, such as phenylhydroxypropyl (meth)acrylate, is more preferred.

The component (a3) may be used either alone or in combination of two or more thereof.

For the purpose of not only making the elastic modulus and the stress relaxation rate of the buffer layer easy to fall within the aforementioned ranges but also improving the film forming properties of the buffer layer-forming composition, the content of the component (a3) in the buffer layer-forming composition is preferably 5 to 40% by mass, more preferably 7 to 35% by mass, still more preferably 10 to 30% by mass, and yet still more preferably 13 to 25% by mass based on the total amount (100% by mass) of the buffer layer-forming composition.

A content ratio [(a2)/(a3)] of the component (a2) and the component (a3) in the buffer layer-forming composition is preferably 0.5 to 3.0, more preferably 1.0 to 3.0, still more preferably 1.3 to 3.0, and yet still more preferably 1.5 to 2.8.

(Polymerizable Compound Other than Components (a1) to (a3))

The buffer layer-forming composition may contain, in addition to the aforementioned components (a1) to (a3), other polymerizable compound within a range where the effects of the present invention are not impaired.

Examples of the other polymerizable compound include alkyl (meth)acrylates having an alkyl group having 1 to 20 carbon atoms; vinyl compounds, such as styrene, hydroxyethyl vinyl ether, hydroxybutyl vinyl ether, N-vinyl formamide, N-vinylpyrrolidone, N-vinyl caprolactam, etc. These other polymerizable compounds may be used either alone or in combination of two or more thereof.

The content of the other polymerizable compound in the buffer layer-forming composition is preferably 0 to 20% by mass, more preferably 0 to 10% by mass, still more preferably 0 to 5% by mass, and yet still more preferably 0 to 2% by mass.

(Photopolymerization Initiator)

On forming the buffer layer, from the viewpoints of shortening the polymerization time by light irradiation and reducing the light irradiation amount, it is preferred that the buffer layer-forming composition further contains a photopolymerization initiator.

Examples of the photopolymerization initiator include a benzoin compound, an acetophenone compound, an acyl phosphinoxide compound, a titanocene compound, a thioxanthone compound, and a peroxide compound, and also a photosensitizer, such as an amine, and a quinone. More specifically, examples thereof include 1-hydroxycyclohexylphenyl ketone, 2-hydroxy-2-methyl-1-phenyl-propan-1-one, benzoin, benzoin methyl ether, benzoin ethyl ether, benzoin isopropyl ether, benzyl phenyl sulfide, tetramethylthiuram monosulfide, azobisisobutyronitrile, dibenzyl, diacetyl, 8-chloroanthraquinone, bis(2,4,6-trimethylbenzoyl)phenylphosphine oxide, etc.

These photopolymerization initiators may be used either alone or in combination of two or more thereof.

The content of the photopolymerization initiator in the buffer layer-forming composition is preferably 0.05 to 15 parts by mass, more preferably 0.1 to 10 parts by mass, and still more preferably 0.3 to 5 parts by mass based on 100 parts by mass of the total amount of the energy ray polymerizable compounds.

(Other Additives)

The buffer layer-forming composition may contain other additives within a range where the effects of the present invention are not impaired. Examples of the other additives include an antistatic agent, an antioxidant, a softener (plasticizer), a filler, a rust-preventing agent, a pigment, a dye, etc. In the case of blending such an additive, the content of each of the additives in the buffer layer-forming composition is preferably 0.01 to 6 parts by mass, and more preferably 0.1 to 3 parts by mass based on 100 parts by mass of the total amount of the energy ray polymerizable compounds.

(Resin Component)

The buffer layer-forming composition may contain a resin component within a range where the effects of the present invention are not impaired. Examples of the resin component include a polyene-thiol-based resin, a polyolefin-based resin, such as, polybutene, polybutadiene, and polymethylpentene, and a thermoplastic resins, such as a styrene-based copolymer. The content of such a resin component in the buffer layer-forming composition is preferably 0 to 20% by mass, more preferably 0 to 10% by mass, still more preferably 0 to 5% by mass, and yet still more preferably 0 to 2% by mass.

[Pressure Sensitive Adhesive Layer]

The pressure sensitive adhesive layer is preferably one having an elastic modulus at 23° C. of 0.10 to 0.50 MPa. On the front face of the semiconductor wafer, a circuit etc. is formed, and irregularities are generally existent. As for the pressure sensitive adhesive tape, when the elastic modulus falls within the aforementioned range, on the occasion of being stuck on the wafer front face with irregularities, it is possible to thoroughly bring the irregularities of the wafer front face into contact with the pressure sensitive adhesive layer and also to appropriately exhibit the adhesion of the pressure sensitive adhesive layer. Accordingly, it becomes possible to surely perform fixation of the pressure sensitive adhesive tape to the semiconductor wafer and also to appropriately protect the wafer front face at the time of back face grinding. From these viewpoints, the elastic modulus of the pressure sensitive adhesive layer is more preferably 0.12 to 0.35 MPa. In the case where the pressure sensitive adhesive layer is formed of an energy ray curable pressure sensitive adhesive, the elastic modulus of the pressure sensitive adhesive layer means an elastic modulus prior to curing upon irradiation with an energy ray and is a value of a storage elastic modulus obtained through measurement by the measuring method in the Examples as described later.

A thickness (D3) of the pressure sensitive adhesive layer is preferably 70 μm or less, more preferably less than 40 μm, still more preferably 35 μm or less, and especially preferably 30 μm or less. In addition, the thickness (D3) is preferably 5 μm or more, and more preferably 10 μm or more. When the pressure sensitive adhesive layer is made thin in this way, a proportion of a low-rigidity portion in the pressure sensitive adhesive tape becomes small. Accordingly, the aforementioned indentation depth (X) hardly becomes large, and chipping of the semiconductor chip generated at the time of back face grinding becomes much more readily prevented. In addition, it is possible to make a tape total thickness relatively thin as described later.

Though the pressure sensitive adhesive layer is formed of, for example, an acrylic pressure sensitive adhesive, a urethane-based pressure sensitive adhesive, a rubber-based pressure sensitive adhesive, a silicone-based pressure sensitive adhesive, etc., it is preferably formed of an acrylic pressure sensitive adhesive.

It is preferred that the pressure sensitive adhesive layer is formed of an energy ray curable pressure sensitive adhesive. When the pressure sensitive adhesive layer is formed of an energy ray curable pressure sensitive adhesive, while setting the elastic modulus at 23° C. to the aforementioned range prior to curing upon irradiation with an energy ray, it is possible to readily release the pressure sensitive adhesive tape from the semiconductor chip after curing.

As the energy ray curable pressure sensitive adhesive, for example, in addition to a non-energy ray curable pressure sensitive adhesive resin (also referred to as "pressure sensitive adhesive resin I"), an energy ray curable pressure sensitive adhesive composition including an energy ray curable compound other than the pressure sensitive adhesive resin (such an energy ray curable pressure sensitive adhesive composition will be hereinafter also referred to as "X-type pressure sensitive adhesive composition") is usable. In addition, as the energy ray curable pressure sensitive adhesive, a pressure sensitive adhesive composition including as a main component an energy ray curable pressure sensitive adhesive resin in which an unsaturated group is introduced into a side chain of a non-energy ray curable pressure sensitive adhesive resin (such an energy ray curable pressure sensitive adhesive resin will be hereinafter also referred to as "pressure sensitive adhesive resin II") and not including an energy ray curable compound other than the pressure sensitive adhesive resin (such a pressure sensitive adhesive composition will be hereinafter also referred to as "Y-type pressure sensitive adhesive composition") may also be used.

Furthermore, as the energy ray curable pressure sensitive adhesive, a combination type of the X-type and the Y-type, namely, an energy ray curable pressure sensitive adhesive composition including, in addition to the energy ray curable pressure sensitive adhesive resin II, an energy ray curable compound other than the pressure sensitive adhesive resin (such an energy ray curable pressure sensitive adhesive composition will be hereinafter also referred to as "XY-type pressure sensitive adhesive composition") may also be used.

Among those, it is preferred to use an XY-type pressure sensitive adhesive composition. When the XY-type pressure sensitive adhesive composition is used, while revealing sufficient pressure sensitive adhesive properties prior to curing, it is possible to thoroughly lower a release force against the semiconductor wafer after curing.

However, the pressure sensitive adhesive may also be formed of a non-energy ray curable pressure sensitive adhesive composition which is not cured even upon irradiation with an energy ray. The non-energy ray curable pressure sensitive adhesive composition is one containing at least the non-energy ray curable pressure sensitive adhesive resin I but not containing the aforementioned energy ray curable pressure sensitive adhesive resin II and energy ray curable compound.

In the following description, the "pressure sensitive adhesive resin" is used as a term referring to either one or both of the foregoing pressure sensitive adhesive resin I and pressure sensitive adhesive resin II. Specifically, examples of the pressure sensitive adhesive resin include an acrylic resin, a urethane-based resin, a rubber-based resin, a silicone-based resin, etc. Among those, an acrylic resin is preferred.

The acrylic pressure sensitive adhesive in which an acrylic resin is used as the pressure sensitive adhesive resin is hereunder described in more detail.

For the acrylic resin, an acrylic polymer (b) is used. The acrylic polymer (b) is one obtained by polymerizing a monomer including at least an alkyl (meth)acrylate and includes a constitutional unit derived from an alkyl (meth) acrylate. As the alkyl (meth)acrylate, the alkyl (meth)acrylate of which the alkyl group has a carbon number of 1 to 20 is exemplified, and the alkyl group may be either linear or branched. Specific examples of the alkyl (meth)acrylate include methyl (meth)acrylate, ethyl (meth)acrylate, isopropyl (meth)acrylate, n-propyl (meth)acrylate, n-butyl (meth)acrylate, 2-ethylhexyl (meth)acrylate, n-octyl (meth)acrylate, isooctyl (meth)acrylate, nonyl (meth)acrylate, decyl (meth)acrylate, undecyl (meth)acrylate, dodecyl (meth)acrylate, etc. The alkyl (meth)acrylate may be used either alone or in combination of two or more thereof.

From the viewpoint of improving an adhesive strength of the pressure sensitive adhesive layer, it is preferred that the acrylic polymer (b) includes a constitutional unit derived from an alkyl (meth)acrylate of which the alkyl group has a carbon number of 4 or more. The carbon number of the alkyl (meth)acrylate is preferably 4 to 12, and more preferably 4 to 6. In addition, the alkyl (meth)acrylate of which the alkyl group has a carbon number of 4 or more is preferably an alkyl acrylate.

In the acrylic polymer (b), the amount of the alkyl (meth)acrylate of which the alkyl group has a carbon number of 4 or more is preferably 40 to 98% by mass, more preferably 45 to 95% by mass, and still more preferably 50 to 90% by mass based on the total amount of monomers constituting the acrylic polymer (b) (hereinafter also referred to simply as "total amount of monomers").

For the purpose of regulating the elastic modulus or pressure sensitive adhesive properties of the pressure sensitive adhesive layer, the acrylic polymer (b) is preferably a copolymer including, in addition to the constitutional unit derived from an alkyl (meth)acrylate of which the alkyl group has a carbon number of 4 or more, a constitutional unit derived from an alkyl (meth)acrylate of which the alkyl group has a carbon number of 1 to 3. The foregoing alkyl (meth)acrylate is preferably an alkyl(meth)acrylate with the carbon number of the alkyl group being 1 or 2, more preferably methyl (meth)acrylate, and most preferably methyl methacrylate. In the acrylic polymer (b), the amount of the alkyl (meth)acrylate of which the alkyl group has a carbon number of 1 to 3 is preferably 1 to 30% by mass, more preferably 3 to 26% by mass, and still more preferably 6 to 22% by mass based on the total amount of monomers.

It is preferred that the acrylic polymer (b) has, in addition to the aforementioned constitutional unit derived from an alkyl (meth)acrylate, a constitutional unit derived from a functional group-containing monomer. Examples of the functional group of the functional group-containing monomer include a hydroxyl group, a carboxy group, an amino group, an epoxy group, etc. The functional group-containing monomer is able to react with a crosslinking agent as described later to serve as a starting point of crosslinking, or to react with an unsaturated group-containing compound to introduce an unsaturated group into a side chain of the acrylic polymer (b).

Examples of the functional group-containing monomer include a hydroxyl group-containing monomer, a carboxy group-containing monomer, an amino group-containing monomer, an epoxy group-containing monomer, etc. These monomers may be used either alone or in combination of two or more thereof. Among those, a hydroxyl group-containing monomer and a carboxy group-containing monomer are preferred, and a hydroxyl group-containing monomer is more preferred.

Examples of the hydroxyl group-containing monomer include hydroxyalkyl (meth)acrylates, such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth) acrylate; and unsaturated alcohols, such as vinyl alcohol, allyl alcohol.

Examples of the carboxy group-containing monomer include ethylenically unsaturated monocarboxylic acids, such as (meth)acrylic acid, and crotonic acid; ethylenically unsaturated dicarboxylic acids, such as fumaric acid, itaconic acid, maleic acid, and citraconic acid, and anhydrides thereof; and 2-carboxyethyl methacrylate.

The amount of the functional monomer is preferably 1 to 35% by mass, more preferably 3 to 32% by mass, and still more preferably 6 to 30% by mass based on the total amount of monomers constituting the acrylic polymer (b).

The acrylic polymer (b) may also include, in addition to the aforementioned constitutional units, a constitutional unit derived from a monomer that is copolymerizable with the aforementioned acrylic monomer, such as styrene, α-methylstyrene, vinyltoluene, vinyl formate, vinyl acetate, acrylonitrile, and acrylamide.

The aforementioned acrylic polymer (b) may be used as the non-energy ray curable pressure sensitive adhesive resin I (acrylic resin). In addition, as the energy ray curable acrylic resin, one obtained by allowing the functional group of the aforementioned acrylic polymer (b) to react with a compound having a photopolymerizable unsaturated group (also referred to as "unsaturated group-containing compound") is exemplified.

The unsaturated group-containing compound is a compound having both a substituent bondable with the functional group of the acrylic polymer (b) and a photopolymerizable unsaturated group. Examples of the photopolymerizable unsaturated group include a (meth)

acryloyl group, a vinyl group, an allyl group, etc. Among those, a (meth)acryloyl group is preferred.

Examples of the substituent bondable with the functional group, which the unsaturated group-containing compound has, include an isocyanate group, a glycidyl group, etc. In consequence, examples of the unsaturated group-containing compound include (meth)acryloyloxyethyl isocyanate, (meth)acryloyl isocyanate, glycidyl (meth)acrylate, etc.

It is preferred that the unsaturated group-containing compound reacts with a part of the functional group of the acrylic polymer (b). Specifically, the unsaturated group-containing compound is allowed to react with the functional group which the acrylic polymer (b) has, in an amount of preferably 50 to 98 mol %, and more preferably 55 to 93 mol %. In this way, in the energy ray curable acrylic resin, when a part of the functional group remains without reacting with the unsaturated group-containing compound, the energy ray curable acrylic resin is readily crosslinked with a crosslinking agent.

A weight average molecular weight (Mw) of the acrylic resin is preferably 300,000 to 1,600,000, more preferably 400,000 to 1,400,000, and still more preferably 500,000 to 1,200,000.

(Energy Ray Curable Compound)

As the energy ray curable compound which is contained in the X-type or XY-type pressure sensitive adhesive composition, a monomer or oligomer having an unsaturated group within the molecule and polymerization-curable upon irradiation with an energy ray is preferred.

Examples of such an energy ray curable compound include polyvalent (meth)acrylate monomers, such as trimethylolpropane tri(meth)acrylate, pentaerythritol (meth)acrylate, pentaerythritol tetra(meth)acrylate, dipentaerythritol hexa(meth)acrylate, 1,4-butylene glycol di(meth)acrylate, and 1,6-hexanediol (meth)acrylate; and oligomers, such as a urethane (meth)acrylate, a polyester (meth)acrylate, a polyether (meth)acrylate, and an epoxy (meth)acrylate.

From the viewpoints that the molecular weight is relatively high, and the elastic modulus of the pressure sensitive adhesive layer is hardly lowered, a urethane (meth)acrylate oligomer is preferred.

A molecular weight of the energy ray curable compound (weight average molecular weight in the case of an oligomer) is preferably 100 to 12,000, more preferably 200 to 10,000, still more preferably 400 to 8,000, and still more preferably 600 to 6,000.

The content of the energy ray curable compound in the X-type pressure sensitive adhesive composition is preferably 40 to 200 parts by mass, more preferably 50 to 150 parts by mass, and still more preferably 60 to 90 parts by mass based on 100 parts by mass of the pressure sensitive adhesive resin.

Meanwhile, the content of the energy ray curable compound in the XY-type pressure sensitive adhesive composition is preferably 1 to 30 parts by mass, more preferably 2 to 20 parts by mass, and still more preferably 3 to 15 parts by mass based on 100 parts by mass of the pressure sensitive adhesive resin. In the XY-type pressure sensitive adhesive composition, the pressure sensitive adhesive resin is energy ray curable, and therefore, even when the content of the energy ray curable compound is small, it is possible to thoroughly lower a release strength after irradiation with an energy ray.

(Crosslinking Agent)

It is preferred that the pressure sensitive adhesive composition further contains a crosslinking agent. The crosslinking agent is, for example, one which reacts with the functional group derived from the functional monomer which the pressure sensitive adhesive resin has, thereby crosslinking the pressure sensitive adhesive resins with each other. Examples of the crosslinking agent include isocyanate-based crosslinking agents, such as tolylene diisocyanate, and hexamethylene diisocyanate, and adducts thereof, epoxy-based crosslinking agents, such as ethylene glycol glycidyl ether; aziridine-based crosslinking agents, such as hexa[1-(2-methyl)-aziridiny]triphosphatriazine; and chelate-based crosslinking agents, such as an aluminum chelate. These crosslinking agents may be used either alone or in combination of two or more thereof.

Among those, from the viewpoint of enhancing a cohesive strength to improve the adhesive strength as well as the viewpoint of easiness of availability, etc., an isocyanate-based crosslinking agent is preferred.

From the viewpoint of accelerating the crosslinking reaction, the blending amount of the crosslinking agent is preferably 0.01 to 10 parts by mass, more preferably 0.03 to 7 parts by mass, and still more preferably 0.05 to 4 parts by mass based on 100 parts by mass of the pressure sensitive adhesive resin.

(Photopolymerization Initiator)

In the case where the pressure sensitive adhesive composition is energy ray curable, it is preferred that the pressure sensitive adhesive composition further contains a photopolymerization initiator. When the photopolymerization initiator is contained, even an energy ray with relatively low energy, such as an ultraviolet ray, is able to thoroughly advance the curing reaction of the pressure sensitive adhesive composition.

Examples of the photopolymerization initiator include a benzoin compound, an acetophenone compound, an acyl phosphinoxide compound, a titanocene compound, a thioxanthone compound, and a peroxide compound, and also a photosensitizer, such as an amine, and a quinone. More specifically, examples thereof include 1-hydroxycyclohexylphenyl ketone, 2-hydroxy-2-methyl-1-phenyl-propan-1-one, benzoin, benzoin methyl ether, benzoin ethyl ether, benzoin isopropyl ether, benzyl phenyl sulfide, tetramethylthiuram monosulfide, azobisisobutyronitrile, dibenzyl, diacetyl, 8-chloroanthraquinone, bis(2,4,6-trimethylbenzoyl)phenylphosphine oxide, etc.

These photopolymerization initiators may be used either alone or in combination of two or more thereof.

The blending amount of the photopolymerization initiator is preferably 0.01 to 10 parts by mass, more preferably 0.03 to 5 parts by mass, and still more preferably 0.05 to 5 parts by mass based on 100 parts by mass of the pressure sensitive adhesive resin.

(Other Additives)

The pressure sensitive adhesive composition may contain other additives within a range where the effects of the present invention are not impaired. Examples of the other additives include an antistatic agent, an antioxidant, a softener (plasticizer), a filler, a rust-preventing agent, a pigment, a dye, etc. In the case of blending such an additive, the content of the additive is preferably 0.01 to 6 parts by mass based on 100 parts by mass of the pressure sensitive adhesive resin.

From the viewpoint of improving coatability on the base or the release sheet, the pressure sensitive adhesive composition may be further diluted with an organic solvent to convert in a solution form of the pressure sensitive adhesive composition.

Examples of the organic solvent include methyl ethyl ketone, acetone, ethyl acetate, tetrahydrofuran, dioxane, cyclohexane, n-hexane, toluene, xylene, n-propanol, isopropanol, etc.

As such an organic solvent, the organic solvent which is used at the time of synthesizing the pressure sensitive adhesive composition may be used as it is, or in order that the solution of the pressure sensitive adhesive composition can be uniformly coated, at least one organic solvent other than the organic solvent which is used at the time of synthesis may be added, too.

[Release Sheet]

On a front face of the pressure sensitive adhesive tape, a release sheet may be stuck. Specifically, the release sheet is stuck on at least one of the front face of the pressure sensitive adhesive layer and the front face of the buffer layer of the pressure sensitive adhesive tape. When the release sheet is stuck on such a front face, it protects the pressure sensitive adhesive layer and the buffer layer. The release sheet is stuck in a releasable manner on the pressure sensitive adhesive tape, and before the pressure sensitive adhesive tape is used (namely, before the wafer back face grinding), the release sheet is released and removed from the pressure sensitive adhesive tape.

As the release sheet, a release sheet in which at least one face thereof is subjected to a release treatment is used, and specifically, examples thereof include one in which a release agent is coated on a front face of a base for release sheet, etc.

The base for release sheet is preferably a resin film. Examples of a resin constituting the resin film include polyester resin films, such as a polyethylene terephthalate resin, a polybutylene terephthalate resin, and a polyethylene naphthalate resin; and polyolefin resins, such as a polypropylene resin, and a polyethylene resin. Examples of the release agent include rubber-based elastomers, such as a silicone-based resin, an olefin-based resin, an isoprene-based resin, a butadiene-based resin, etc., a long-chain alkyl-based resin, an alkyd-based resin, and a fluorine-based resin.

Though a thickness of the release sheet is not particularly limited, it is preferably 10 to 200 μm, and more preferably 20 to 150 μm.

Though a tape total thickness of the pressure sensitive adhesive tape is not particularly limited, it is preferably 30 to 300 μm. When the tape total thickness of the pressure sensitive adhesive tape falls within the aforementioned range, it becomes possible to appropriately maintain a pressure sensitive adhesion performance of the pressure sensitive adhesive layer and an impact absorption performance of the buffer layer, thereby thoroughly exhibiting the function as the pressure sensitive adhesive tape. From the foregoing viewpoint, the tape total thickness is more preferably 40 to 220 μm, and still more preferably 45 to 160 μm. When the tape total thickness of the pressure sensitive adhesive tape is 160 μm or less, the release strength on releasing the semiconductor chip from the pressure sensitive adhesive tape becomes easily small.

In the present specification, the tape total thickness means a total thickness of the layers which are stuck on the semiconductor wafer and contained in the pressure sensitive adhesive tape on grinding the semiconductor wafer. In consequence, in the case where the release sheet stuck in a releasable manner is provided in the pressure sensitive adhesive tape, the thickness of the release sheet is not included in the total thickness. In general, the total thickness of the pressure sensitive adhesive tape is a total thickness of the base, the pressure sensitive adhesive layer, and the buffer layer.

(Production Method of Pressure Sensitive Adhesive Tape)

A production method of the pressure sensitive adhesive tape of the present invention is not particularly limited, and the pressure sensitive adhesive tape may be produced by a known method.

For example, by sticking a buffer layer provided on a release sheet and a pressure sensitive adhesive layer provided on the release sheet on both faces of a base, respectively, the pressure sensitive adhesive tape in which the release sheets are stuck on the both front faces of the buffer layer and the pressure sensitive adhesive layer can be produced. The release sheets to be stuck on the both front faces of the buffer layer and the pressure sensitive adhesive layer may be properly released and removed prior to use of the pressure sensitive adhesive tape.

As for a method of forming the buffer layer or the pressure sensitive adhesive layer on the release sheet, the buffer layer or the pressure sensitive adhesive layer can be formed by coating a buffer layer-forming composition or a pressure sensitive adhesive (pressure sensitive adhesive composition) directly on the release sheet by a known coating method, to form a coated film and irradiating this coated film with an energy ray or heat drying the coated film.

The buffer layer and the pressure sensitive adhesive layer may also be formed by coating each of the buffer layer-forming composition and the pressure sensitive adhesive (pressure sensitive adhesive composition) directly on the both faces of the base, respectively. Furthermore, while coating the buffer layer-forming composition or the pressure sensitive adhesive (pressure sensitive adhesive composition) directly on one face of the base to form the buffer layer and the pressure sensitive adhesive layer, the pressure sensitive adhesive layer or the buffer layer provided on the release sheet may also be stuck on the other face of the base.

Examples of a coating method of the buffer layer-forming composition and the pressure sensitive adhesive include a spin coating method, a spray coating method, a bar coating method, a knife coating method, a roll coating method, a blade coating method, a the coating method, a gravure coating method, etc. In addition, in order to improve coatability, the buffer layer-forming composition or the pressure sensitive adhesive composition may be blended in an organic solvent to convert in a solution form and then coated on the release sheet.

In the case where the buffer layer-forming composition includes an energy ray polymerizable compound, it is preferred that the coated film of the buffer layer-forming composition is cured upon irradiation with an energy ray, to form the buffer layer. Curing of the buffer layer may be performed by a curing treatment of one time, or may be dividedly performed several times. For example, after completely curing the coated film on the release sheet to form the buffer layer, the resultant may be stuck on the base, or after forming a buffer layer-forming film in a semi-cured state without completely curing the coated film and then sticking the buffer layer-forming film on the base, an energy ray may be again irradiated to completely cure the buffer layer-forming film, thereby forming the buffer layer. As the energy ray to be irradiated in the curing treatment, an ultraviolet ray is preferred. On the occasion of curing, though the coated film of the buffer layer-forming composition may be in an exposed state, it is preferred that the curing is performed upon irradiation with an energy ray in a state that the coated film is covered by the release sheet or the base, so that the coated film is not exposed.

[Production Method of Semiconductor Device]

As described above, in the dicing before grinding method, the pressure sensitive adhesive tape of the present invention is used on the occasion when it is stuck on the front face of the semiconductor wafer, and the back face grinding of the wafer is performed. More specifically, the pressure sensitive adhesive tape of the present invention is used in the production method of a semiconductor device.

Specifically, the production method of a semiconductor device of the present invention includes at least the following steps 1 to 4.

Step 1: A step of sticking the aforementioned pressure sensitive adhesive tape on a front face of a semiconductor wafer.

Step 2: A step of forming a groove from the front face side of the semiconductor wafer, or forming a modified region in the inside of the semiconductor wafer from the front face or back face of the semiconductor wafer.

Step 3: A step of grinding the semiconductor wafer in which the pressure sensitive adhesive tape is stuck on the front face thereof, and the groove or modified region is formed, from the back face side to singulate the semiconductor wafer into plural chips starting from the groove or modified region.

Step 4: A step of releasing the pressure sensitive adhesive tape from the singulated semiconductor wafer (namely, plural semiconductor chips).

The respective steps of the production method of a semiconductor device as described above are hereunder described in detail.

(Step 1)

In the step 1, the pressure sensitive adhesive tape of the present invention is stuck on the front face of the semiconductor wafer via the pressure sensitive adhesive layer. Though the present step may be performed prior to the step 2 as described later, it may also be performed after the step 2. For example, in the case where a modified region is formed in the semiconductor wafer, it is preferred that the step 1 is performed prior to the step 2. On the other hand, in the case where a groove is formed on the front face of the semiconductor wafer by dicing etc., the step 1 is performed after the step 2. That is, in the present step 1, the pressure sensitive adhesive tape is stuck on the front face of the wafer having the groove formed in the step 2 as described later.

The semiconductor wafer which is used in the present production method may be a silicon wafer, or may also be a wafer of gallium-arsenic, etc. or a glass wafer. Though a thickness of the semiconductor wafer prior to grinding is not particularly limited, it is typically about 500 to 1,000 µm. In addition, in the semiconductor wafer, a circuit is generally formed on the front face thereof. The formation of a circuit on the wafer front face can be performed by a variety of methods inclusive of a conventionally generalized method, such as an etching method, and a lift-off method.

(Step 2)

In the step 2, a groove is formed from the front face side of the semiconductor wafer, or a modified region is formed in the inside of the semiconductor wafer from the front face or back face of the semiconductor wafer.

The groove which is formed in the present step is a groove whose depth is shallower than the thickness of the semiconductor wafer. It is possible to perform the formation of the groove by dicing using a conventionally known wafer dicing apparatus etc. In addition, in the step 3 as described later, the semiconductor wafer is divided into plural semiconductor chips along the groove.

The modified region is a portion which has been made fragile in the semiconductor wafer and is a region serving as a starting point from which the semiconductor wafer is singulated into semiconductor chips due to the matter that the semiconductor wafer becomes thin by grinding in the grinding step, or the semiconductor wafer is broken upon application with a force by grinding. That is, in the step 2, the groove and the modified region are formed along a parting line on the occasion when in the step 3 as described later, the semiconductor wafer is divided and singulated into semiconductor chips.

The formation of the modified region is performed upon irradiation with a laser focused on the inside of the semiconductor wafer, and the modified region is formed in the inside of the semiconductor wafer. The irradiation with a laser may be performed from either the front face side or the back face side of the semiconductor wafer. In an embodiment of forming the modified region, in the case where the step 2 is performed after the step 1, and the laser irradiation is performed from the wafer front face, the laser is irradiated on the semiconductor wafer via the pressure sensitive adhesive tape.

The semiconductor wafer in which not only the pressure sensitive adhesive tape is stuck, but also the groove or modified region is formed is placed on a chuck table and adsorbed on the chuck table and held. On that occasion, the semiconductor wafer is adsorbed in a state that the front face side thereof is disposed on the table side.

(Step 3)

After the aforementioned steps 1 and 2, the back face of the semiconductor wafer on the chuck table is ground, thereby singulating the semiconductor wafer into plural semiconductor chips.

Here, in the case where the groove is formed in the semiconductor wafer, the back face grinding is performed such that the semiconductor wafer is made thin until a position reaching at least a bottom of the groove. According to this back face grinding, the groove becomes a notch penetrating through the wafer, and the semiconductor wafer is divided by the notch and singulated into individual semiconductor chips.

Meanwhile, in the case where the modified region is formed, though the ground face (wafer back face) may reach the modified region by grinding, the ground face does not have to reach the modified region completely. That is, the semiconductor wafer may be ground until a position in the vicinity of the modified region such that the semiconductor wafer is broken starting from the modified region and singulated into semiconductor chips. For example, the actual singulation of the semiconductor chip may also be performed by sticking a pickup tape as described later and then stretching the pickup tape.

A shape of the singulated semiconductor chip may be a square or an elongated shape, such as a rectangle. In addition, though a thickness of the singulated semiconductor chip is not particularly limited, it is preferably about 5 to 100 µm, and more preferably 10 to 45 µm. In addition, although a size of the singulated semiconductor chip is not particularly limited, the chip size is preferably less than 50 $mm^2$, more preferably less than 30 $mm^2$, and still more preferably less than 10 $mm^2$.

When the pressure sensitive adhesive tape of the present invention is used, even in such a thin type and/or small-sized semiconductor chip, generation of chipping in the semiconductor chip is prevented at the time of back face grinding (step 3).

(Step 4)

Subsequently, the pressure sensitive adhesive tape for semiconductor processing is released from the singulated semiconductor wafer (namely, plural semiconductor chips). The present step is, for example, performed by the following method.

First of all, in the case where the pressure sensitive adhesive layer of the pressure sensitive adhesive tape is formed of an energy ray curable pressure sensitive adhesive, the pressure sensitive adhesive layer is cured upon irradiation with an energy ray. Subsequently, a pickup tape is stuck on the back face side of the singulated semiconductor wafer, and the position and direction are adjusted so as to make it possible to achieve pickup. On that occasion, a ring frame disposed on the circumferential side of the wafer is also stuck to the pickup tape, and a circumferential edge part of the pickup tape is fixed to the ring frame. To the pickup tape, the wafer and the ring frame may be simultaneously stuck, or may be stuck at separate timings. Subsequently, the pressure sensitive adhesive tape is released from the plural semiconductor chips fixed on the pickup tape.

Thereafter, the plural semiconductor chips existent on the pickup tape are picked up and fixed on the base etc., thereby producing a semiconductor device.

Though the pickup tape is not particularly limited, for example, it is configured of the pressure sensitive adhesive sheet including the base and the pressure sensitive adhesive layer provided on one face of the base.

EXAMPLES

The present invention is hereunder described in more detail based on Examples, but it should not be construed that the present invention is limited by these Examples.

The measuring methods and evaluation methods in the present invention are as follows.

[Mass Average Molecular Weight (Mw)]

The measurement was performed under the following conditions by using a gel permeation chromatograph (a product name: HLC-8020, manufactured by Tosoh Corporation), and measured values expressed in terms of standard polystyrene were used.

(Measurement Conditions)
  Column: "TSK guard column HXL-H", "TSK gel GMHXL (×2)", and "TSK gel G2000HXL" (all are manufactured by Tosoh Corporation)
  Column temperature: 40° C.
  Developing solvent: Tetrahydrofuran
  Flow rate: 1.0 mL/min

[Measurement of Indentation Depth (X)]

The measurement was performed in an environment at 23° C. and 50% RH (relative humidity) by using a dynamic ultra micro hardness tester (a product name: DUH-W201S, manufactured by Shimadzu Corporation) and, as an indenter, a triangular pyramid indenter having a tip radius of curvature of 100 nm and an apex angle of 115°.

Specifically, in the case where a buffer layer was protected by a release sheet, after removing the release sheet, the resulting pressure sensitive adhesive tape was placed on a glass plate of the dynamic ultra micro hardness tester such that a buffer layer of the pressure sensitive adhesive tape was exposed, the tip of the aforementioned triangular pyramid indenter was indented at a rate of 10 μm/min into the buffer layer, and an indentation depth (X) when a compression load reached 2 mN was measured.

[Young's Modulus of Base]

The Young's modulus of a base was measured at a test speed of 200 mm/min in conformity with JIS K-7127 (1999).

[Elastic Modulus of Buffer Layer and Maximum Value of Tan δ]

A buffer layer for test was produced in the same method as in buffer layers of Examples and Comparative Examples as described later, except that a release sheet (a trade name: "SP-PET381031", manufactured by Lintec Corporation, thickness: 38 μm) was used in place of a base, and that the thickness of the obtained buffer layer was set to 200 μm. Using a test piece obtained by removing the release sheet on the buffer layer for test and then cutting off in a predetermined size, a loss elastic modulus and a storage elastic modulus in a temperature range of from −20 to 150° C. were measured at a frequency of 11 Hz with a dynamic viscoelasticity measuring apparatus (a trade name: "Rheovibron DDV-II-EP1", manufactured by Orientec Co., Ltd.).

A value of the "(loss elastic modulus)/(storage elastic modulus)" at each temperature was calculated as the tan δ at that temperature, and a maximum value of the tan δ in the range of from −5 to 120° C. was defined as "maximum value of tan δ of buffer layer".

[Stress Relaxation Rate of Buffer Layer]

A buffer layer for test was produced on a release sheet in the same manner as described above and cut off in a size of 15 mm×140 mm, thereby forming a sample. Using a universal tensile testing machine (autograph AG-10kNIS, manufactured by Shimadzu Corporation), 20 mm of both ends of this sample was held and pulled at a speed of 200 mm per minutes, and a stress A ($N/m^2$) at the 10% stretch and a stress B ($N/m^2$) after 1 minute from stop of the tape stretch were measured. From the values of A and B thereof, $[(A-B)/A \times 100(\%)]$ was calculated as the stress relaxation rate.

[Elastic Modulus of Pressure Sensitive Adhesive Layer]

Using a viscoelasticity measuring apparatus (an apparatus name: "Dynamic Analyzer RDAII", manufactured by Rheometrics, Inc.), a sample having a size of 8 mm in diameter×3 mm in thickness, as obtained by laminating a single-layered pressure sensitive adhesive layer formed of a solution of a pressure sensitive adhesive composition used in each of the Examples and Comparative Examples was measured by a torgional shear method for a storage elastic modulus G' at 1 Hz in an environment at 23° C., and the obtained value was defined as an elastic modulus of the pressure sensitive adhesive layer.

[Measurement of Thickness of Pressure Sensitive Adhesive Tape]

A total thickness of a pressure sensitive adhesive tape and thicknesses of a base, a pressure sensitive adhesive layer, and a buffer layer were measured with a constant pressured thickness measuring instrument (PG-02, manufactured by Teclock Corporation). On that occasion, arbitrary ten points were measured, and an average value was calculated.

In the present Examples, the total thickness of the pressure sensitive adhesive tape is a value obtained by measuring a thickness of a pressure sensitive adhesive tape with a release sheet and subtracting a thickness of the release sheet from the foregoing thickness. Furthermore, the thickness of the buffer layer is a value obtained by subtracting a thickness of a base from a thickness of a base with a buffer layer. In addition, the thickness of the pressure sensitive adhesive layer is a value obtained by subtracting the thicknesses of the buffer layer and the base from total thickness of the pressure sensitive adhesive tape.

[Chipping Test 1]

A groove was formed from a wafer front face of a silicon wafer having a diameter of 12 inches (30.48 cm); thereafter, a pressure sensitive adhesive tape was stuck on the wafer front face; and the resulting wafer was singulated into chips having a thickness of 30 µm and a chip size of 1 mm in square by the dicing before grinding method for singulating the wafer by back face grinding. Thereafter, while not releasing the pressure sensitive adhesive tape, edge portions of the singulated chips from the wafer ground face were observed by a digital microscope (VE-9800, manufactured by Keyence Corporation); the presence or absence of chipping of the edges of each chip was observed; and a chipping generation rate in 700 chips was measured and evaluated according to the following criteria.

A: Less than 1.0%, B: 1.0 to 2.0%, C: more than 2.0%

[Chip Crack Test 2]

First of all, a pressure sensitive adhesive tape was stuck on a front face of a silicon wafer having a diameter of 12 inches (30.48 cm). Next, a lattice-shaped modified region was formed in the silicon wafer with a laser saw from a face on the opposite side to the face on which the pressure sensitive adhesive tape was stuck. A lattice size was set to 1 mm in square. Subsequently, the resulting wafer was ground using a back face grinding apparatus until the thickness reached 30 µm, thereby singulating into chips of 1 mm in square. After the grinding step, energy ray irradiation was performed; a dicing tape (a product name; "D-821HS", manufactured by Lintec Corporation) was stuck on a face on the opposite side to the face on which the pressure sensitive adhesive tape was stuck; while not releasing the pressure sensitive adhesive tape, the singulated chips were observed over the dicing tape by a digital microscope; the presence or absence of a chip crack of the edges of each chip was observed; and a chip crack generation rate in 700 chips was measured and evaluated according to the following criteria.

A: Less than 1.0%, B: 1.0 to 2.0%, C: more than 2.0%

All of parts by mass in the following Examples and Comparative Examples are a solid content value.

Example 1

(1) Synthesis of Urethane Acrylate-Based Oligomer

An isocyanate-terminated urethane prepolymer obtained through a reaction of a polyester diol and isophorone diisocyanate was allowed to react with 2-hydroxyethyl acrylate, thereby obtaining a bifunctional urethane acrylate-based oligomer (UA-1) having a mass average molecular weight (Mw) of 5,000.

(2) Preparation of Buffer Layer-Forming Composition 40 parts by mass of the above-synthesized urethane acrylate-based oligomer (UA-1), 40 parts by mass of isobornyl acrylate (IBXA), and 20 parts by mass of phenylhydroxypropyl acrylate (HPPA) were blended, and 2.0 parts by mass of 1-hydroxycyclohexylphenyl ketone (a product name: "Irgacure 184", manufactured by BASF SE) as a photopolymerization initiator and 0.2 parts by mass of a phthalocyanine-based pigment were further blended, thereby preparing a buffer layer-forming composition.

(3) Preparation of Pressure Sensitive Adhesive Composition

An acrylic polymer (b) obtained through copolymerization of 52 parts by mass of butyl acrylate (BA), 20 parts by mass of methyl methacrylate (MMA), and 28 parts by mass of 2-hydroxyethyl acrylate (HEA) was allowed to react with 2-methacryloyloxyethyl isocyanate (MOI) so as to add to 90 mol % of a hydroxyl group among all hydroxyl groups of the acrylic polymer (b), thereby obtaining an energy ray curable acrylic resin (weight average molecular weight: 500,000).

To 100 parts by mass of this energy ray curable acrylic resin, 6 pats by weight of a polyfunctional urethane acrylate (a trade name: SHIKOH UT-4332, manufactured by The Nippon Synthetic Chemical Industry Co., Ltd.) that is an energy ray curable compound, 0.375 parts by mass on a solid content basis of an isocyanate-based crosslinking agent (a trade name: BHS-8515, manufactured by Toyochem Co., Ltd.), and 1 part by weight of a photopolymerization initiator composed of bis(2,4,6-trimethylbenzoyl)phenylphosphine oxide were added, and the contents were diluted with a solvent, thereby preparing a coating solution of pressure sensitive adhesive composition.

(4) Production of Pressure Sensitive Adhesive Tape

The above-obtained buffer layer-forming composition was coated on one face of a polyethylene terephthalate film (Young's modulus: 2,500 MPa) having a thickness of 50 µm as a base, and an ultraviolet ray was irradiated under conditions at an illuminance of 160 mW/cm$^2$ and an irradiation amount of 500 mJ/cm$^2$ to cure the buffer layer-forming composition, thereby obtaining a buffer layer having a thickness of 13 µm.

In addition, on a release-treated face of a release sheet in which a release sheet base is a polyethylene terephthalate film (a trade name: SP-PET381031, manufactured by Lintec Corporation), the above-described coating solution of pressure sensitive adhesive composition was coated in a thickness after drying of 20 µm and then heat dried, thereby forming a pressure sensitive adhesive layer on the release sheet. This pressure sensitive adhesive layer was stuck on one face, on which the buffer layer is not formed, of the base having the buffer layer, thereby obtaining a pressure sensitive adhesive sheet tape with a release sheet.

The pressure sensitive adhesive layer in Example 1 had an elastic modulus at 23° C. of 0.15 MPa. In addition, the buffer layer had a storage elastic modulus of 250 MPa, a stress relation rate of 90%, and a maximum value of tan δ of 1.24.

Examples 2 to 9 and Comparative Examples 1 to 9

The same procedures as in Example 1 were carried out, except for changing the thicknesses of the base, the buffer layer, and the pressure sensitive adhesive layer as described in Table 1.

As the base in each of the Examples and Comparative Examples, a polyethylene terephthalate film having the same Young's modulus as in Example 1 was used.

TABLE 1

| | Thickness (μm) | | | | | | | |
|---|---|---|---|---|---|---|---|---|
| | Base (D1) | Buffer layer (D2) | Pressure sensitive adhesive layer (D3) | Tape total thickness | D2/D1 | Indentation depth (X) | Chipping Test 1 | Chip Crack Test 2 |
| Example 1 | 50 | 13 | 20 | 83 | 0.26 | 2.3 | A | — |
| Example 2 | 50 | 33 | 20 | 103 | 0.66 | 2.5 | A | A |
| Example 3 | 25 | 13 | 20 | 58 | 0.52 | 2.4 | A | — |
| Example 4 | 100 | 13 | 20 | 133 | 0.13 | 1.5 | A | — |
| Example 5 | 100 | 33 | 20 | 153 | 0.33 | 1.8 | A | — |
| Example 6 | 100 | 53 | 20 | 173 | 0.53 | 2.2 | A | A |
| Example 7 | 100 | 63 | 20 | 183 | 0.63 | 2.5 | A | — |
| Example 8 | 50 | 33 | 60 | 143 | 0.66 | 2.5 | A | A |
| Example 9 | 100 | 43 | 70 | 213 | 0.43 | 2.0 | A | A |
| Comparative Example 1 | 50 | 53 | 20 | 123 | 1.06 | 3.5 | B | B |
| Comparative Example 2 | 50 | 63 | 20 | 133 | 1.26 | 3.7 | C | — |
| Comparative Example 3 | 50 | 83 | 20 | 153 | 1.66 | 4.2 | C | — |
| Comparative Example 4 | 25 | 33 | 20 | 78 | 1.32 | 2.8 | B | — |
| Comparative Example 5 | 25 | 53 | 20 | 98 | 2.12 | 3.6 | C | — |
| Comparative Example 6 | 25 | 63 | 20 | 108 | 2.52 | 3.7 | C | — |
| Comparative Example 7 | 25 | 83 | 20 | 128 | 3.32 | 4.0 | C | — |
| Comparative Example 8 | 100 | 83 | 20 | 203 | 0.83 | 2.8 | B | — |
| Comparative Example 9 | 50 | 53 | 60 | 163 | 1.06 | 2.9 | B | B |

The symbol "—" in the table expresses that the test was not carried out.

In the light of the above, in Examples 1 to 9, by regulating the thickness ratio (D2/D1) of the pressure sensitive adhesive tape to 0.7 or less and the indentation depth (X) to 2.5 μm, respectively, in the dicing before grinding method, on performing back face grinding of the semiconductor wafer to singulate into chips, chipping was able to be prevented. On the other hand, in Comparative Examples 1 to 9, the thickness ratio (D2/D1) and the indentation depth (X) did not fall within the predetermined ranges, and the chipping was not able to be thoroughly prevented.

The invention claimed is:

1. A method for producing a semiconductor device, comprising:
   sticking a pressure sensitive adhesive tape on a front face of a semiconductor wafer;
   forming a groove from the front face of the semiconductor wafer, or forming a modified region in an inside of the semiconductor wafer from the front face ora back face of the semiconductor wafer;
   grinding the semiconductor wafer on which the pressure sensitive adhesive tape is stuck on the front face thereof, and the groove or modified region is formed, from the back face side to cingulate the semiconductor wafer into plural chips starting from the groove or modified region; and
   releasing the pressure sensitive adhesive tape from the plural chips,
   wherein the pressure sensitive adhesive tape comprises:
   a base,
   a buffer layer provided on one face of the base, and
   a pressure sensitive adhesive layer provided on the other face of the base,
   wherein the pressure sensitive adhesive tape has a ratio of a thickness of the buffer layer to a thickness of the base of 0.7 or less and an indentation depth of a front face on the buffer layer side of 2.5 μm or less.

2. The method according to claim 1, wherein the base of the pressure sensitive adhesive tape has a Young's modulus of 1,000 MPa or more.

3. The method according to claim 1, wherein the thickness of the base of the pressure sensitive adhesive tape is 110 μm or less.

4. The method according to claim 1, wherein the base of the pressure sensitive adhesive tape has at least a polyethylene terephthalate film.

5. The method according to claim 1, wherein the buffer layer of the pressure sensitive adhesive tape is formed of a buffer layer-forming composition comprising:
   a urethane (meth)acrylate,
   a first polymerizable compound having an alicyclic group or a heterocyclic group each having a ring-forming atom number of 6 to 20, and
   a second polymerizable compound having a functional group.

6. The method according to claim 5, wherein the first polymerizable compound is an alicyclic group-containing (meth)acrylate, and
   the second polymerizable compound is a hydroxyl group-containing (meth)acrylate.

7. The method according to claim 5, wherein:
   the base of the pressure sensitive adhesive tape has a Young's modulus of 1,000-30,000 MPa;
   the thickness of the base of the pressure sensitive adhesive tape is 15-110 μm;
   the pressure sensitive adhesive layer of the pressure sensitive adhesive tape has an elastic modulus at 23° C. of 0.10 to 0.50 MPa; and
   the pressure sensitive adhesive layer of the pressure sensitive adhesive tape has a thickness of 5-70 μm.

8. The method according to claim 7, wherein:
the first polymerizable compound is an alicyclic group-containing (meth)acrylate, and
the second polymerizable compound is a hydroxyl group-containing (meth)acrylate.

9. The method according to claim 8, wherein the pressure sensitive adhesive tape has a ratio of a thickness of the buffer layer to a thickness of the base of 0.10 to 0.7 and an indentation depth of a front face on the buffer layer side of 1.0 to 2.5 µm.

10. The method according to claim 7, wherein the pressure sensitive adhesive tape has a ratio of a thickness of the buffer layer to a thickness of the base of 0.10 to 0.7 and an indentation depth of a front face on the buffer layer side of 1.0 to 2.5 µm.

11. The method according to claim 7, wherein the pressure sensitive adhesive tape has a ratio of a thickness of the buffer layer to a thickness of the base of 0.13 to 0.66 and an indentation depth of a front face on the buffer layer side of 1.5 to 2.4 µm.

12. The method according to claim 1, wherein the pressure sensitive adhesive layer of the pressure sensitive adhesive tape has an elastic modulus at 23° C. of 0.10 to 0.50 MPa.

13. The method according to claim 1, wherein the pressure sensitive adhesive layer of the pressure sensitive adhesive tape has a thickness of 70 µm or less.

14. The method according to claim 1, wherein:
the base of the pressure sensitive adhesive tape has a Young's modulus of 1,000-30,000 MPa;
the thickness of the base of the pressure sensitive adhesive tape is 15-110 µm;
the pressure sensitive adhesive layer of the pressure sensitive adhesive tape has an elastic modulus at 23° C. of 0.10 to 0.50 MPa; and
the pressure sensitive adhesive layer of the pressure sensitive adhesive tape has a thickness of 5-70 µm.

15. The method according to claim 14, wherein the pressure sensitive adhesive tape has a ratio of a thickness of the buffer layer to a thickness of the base of 0.10 to 0.7 and an indentation depth of a front face on the buffer layer side of 1.0 to 2.5 µm.

16. The method according to claim 14, wherein the pressure sensitive adhesive tape has a ratio of a thickness of the buffer layer to a thickness of the base of 0.13 to 0.66 and an indentation depth of a front face on the buffer layer side of 1.5 to 2.4 µm.

17. The method according to claim 1, comprising forming a groove from the front face of the semiconductor wafer.

18. The method according to claim 1, comprising forming a modified region in an inside of the semiconductor wafer from the front face or a back face of the semiconductor wafer.

19. The method according to claim 1, wherein the pressure sensitive adhesive tape has a ratio of a thickness of the buffer layer to a thickness of the base of 0.10 to 0.7 and an indentation depth of a front face on the buffer layer side of 1.0 to 2.5 µm.

20. The method according to claim 1, wherein the pressure sensitive adhesive tape has a ratio of a thickness of the buffer layer to a thickness of the base of 0.13 to 0.66 and an indentation depth of a front face on the buffer layer side of 1.5 to 2.4 µm.

* * * * *